(12) United States Patent
Jaussi et al.

(10) Patent No.: US 9,106,217 B2
(45) Date of Patent: Aug. 11, 2015

(54) WIDTH SCALABLE CONNECTOR FOR HIGH BANDWIDTH IO INTERFACES

(75) Inventors: James E. Jaussi, Hillsboro, OR (US); Bruce E. Pederson, Beaverton, OR (US); Howard L. Heck, Hillsboro, OR (US); Stephen R. Mooney, Mapleton, UT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,050

(22) PCT Filed: Dec. 6, 2011

(86) PCT No.: PCT/US2011/063566
§ 371 (c)(1),
(2), (4) Date: Mar. 10, 2014

(87) PCT Pub. No.: WO2013/085495
PCT Pub. Date: Jun. 13, 2013

(65) Prior Publication Data
US 2014/0184270 A1    Jul. 3, 2014

(51) Int. Cl.
| | |
|---|---|
| H03K 19/0175 | (2006.01) |
| H03K 19/00 | (2006.01) |
| H01R 13/66 | (2006.01) |
| H01R 24/60 | (2011.01) |
| H01R 25/00 | (2006.01) |
| H01R 12/72 | (2011.01) |

(52) U.S. Cl.
CPC ........ *H03K 19/0008* (2013.01); *H01R 13/6658* (2013.01); *H01R 24/60* (2013.01); *H01R 25/006* (2013.01); *H03K 19/0175* (2013.01); *H01R 12/722* (2013.01); *H01R 12/727* (2013.01)

(58) Field of Classification Search
None
See application file for complete search history.

(56) References Cited

U.S. PATENT DOCUMENTS

| | | | |
|---|---|---|---|
| 4,898,543 A | 2/1990 | Benze | |
| 5,955,703 A | 9/1999 | Daly et al. | |
| 6,024,607 A * | 2/2000 | Wahl | 439/639 |
| 6,860,762 B2 | 3/2005 | Spykerman et al. | |
| 7,165,998 B2 * | 1/2007 | Lee et al. | 439/660 |
| 7,318,752 B2 * | 1/2008 | Fujimoto et al. | 439/660 |
| 7,527,527 B2 | 5/2009 | Morlion et al. | |
| 2002/0123256 A1 | 9/2002 | Brickett | |

FOREIGN PATENT DOCUMENTS

WO    2013/085495 A1    6/2013

OTHER PUBLICATIONS

International Preliminary Report on Patentability and Written Opinion received for PCT Patent Application No. PCT/US2011/063566, mailed on Jun. 19, 2014, 6 pages.
International Search Report and Written Opinion received for PCT application No. PCT/US2011/063566, mailed on Aug. 7, 2012, 9 pages.

* cited by examiner

*Primary Examiner* — Anh Tran
(74) *Attorney, Agent, or Firm* — Jordan IP Law, LLC

(57) ABSTRACT

Disclosed is a scalable input/output interface that has multiple bays and includes a housing surrounding a plurality of pairs of substrates. A first substrate of the pair of substrates may have a first contact surface and a second substrate of the pair of substrates may have a second contact surface that opposes the first contact surface, wherein each substrate has a connection edge. At least one integrated buffer can be coupled to either the first side or the second side of each substrate. A plurality of rows of contacts can be coupled to the opposing surfaces of each substrate of the pair of substrates, wherein each row of contacts can be stacked substantially parallel to the connection edge. Each connection edge can also be coupled to a separate integrated buffer.

26 Claims, 3 Drawing Sheets

WIDTH SCALABLE CONNECTOR FOR HIGH BANDWIDTH IO INTERFACES

BACKGROUND

1. Technical Field

Embodiments are generally related to input/output (IO) interfaces and, more particularly, to a width scalable connector for high bandwidth consumer applications.

2. Discussion

Future platforms and "consumption devices" (like flash or Phase Change Memory Stacked/PCMS drives) may demand higher bandwidths than offered by current input/output (IO) interface solutions such as USB (Universal Serial Bus, e.g., USB Specification 3.0 Rev. 1.0, Nov. 12, 2008, USB Implementers Forum), and PCIE ("Peripheral Component Interconnect Express", e.g., PCI Express x16 Graphics 150W-ATX Specification 1.0, PCI Special interest Group) solutions. This development may require replacing existing connector technologies due to potentially excessive signal degradation at frequencies below 10 GHz. Indeed, a large enabling effort associated with new connector technologies may place a demand for multiple generation (10+ year) scalability on any new connector.

For example, USB devices may be configured to couple to other USB compatible devices using a standardized USB connector. Included in the USB connector can be a power source connection, which transfers power between coupled USB devices. Although USB connections have gone through multiple generations of development, the capabilities of USB connectors may be nearing a limit.

BRIEF DESCRIPTION OF THE ACCOMPANYING DRAWINGS

The various advantages of the disclosed embodiments will become apparent to one skilled in the art by reading the following specification and appended claims and by referencing the following drawings in which:

DETAILED DESCRIPTION

There may be a need for an IO interface that will support high power bandwidth when needed, but scale hack power/bandwidth when low or no bandwidth is required as opposed to a single rate model (per generation) of USB and other interfaces today. Such an approach may also enable tailoring the characteristics of the interface per platform.

Existing external interfaces such as USB and eSATA (external Serial Advanced Technology Attachment, e.g., Serial ATA Rev. 3.0 Specification, May 27, 2009. SATA International Organization/SATA-IO) may rely on connector technology whose scalability may be limited to approximately 10 Gb/s. The emergence of new applications (e.g., external high definition/HD display, multi-terabyte solid state storage) could make it likely that consumer device bandwidth demand may exceed the available capacity of those interfaces. Additionally, explosive growth in the tablet and hand-held deuce industry may provide an opportunity to reduce the physical size of connectors. At the same time, existing connectors (e.g., USB 3.0) might not be able to provide sufficient current capacity to support bus powered devices. The confluence of these factors may enhance the opportunity for a new connector technology that allows cost effective, performance scalable solutions for future generations of computing and consumer devices.

Figure 1:
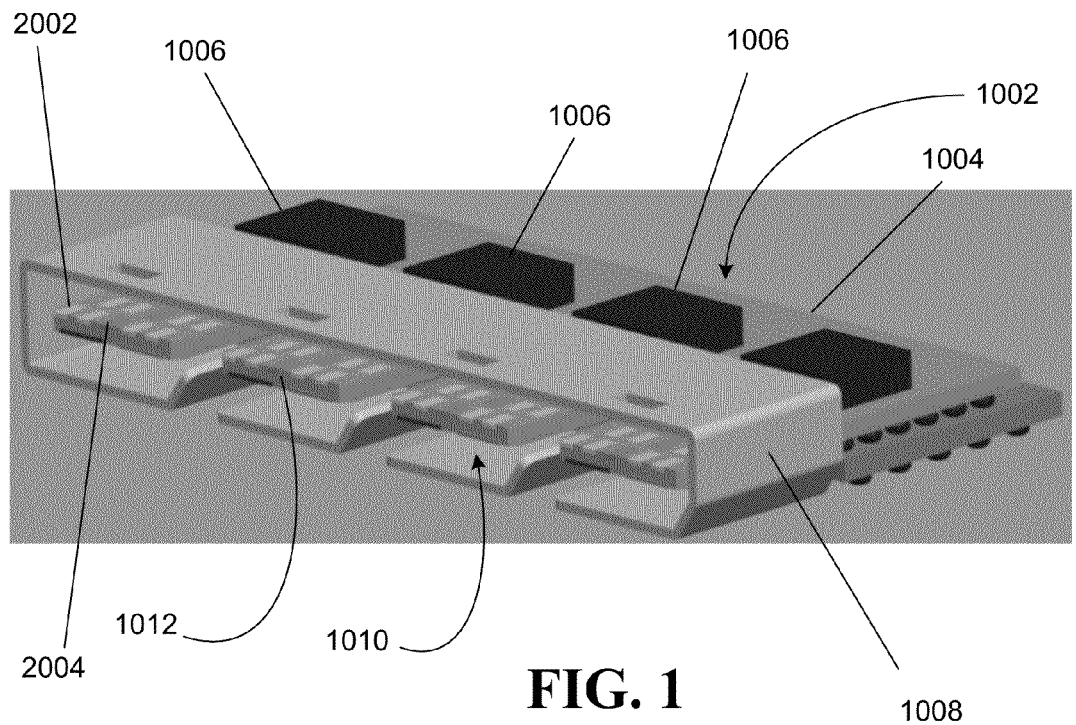
FIG. 1 shows a top perspective view of an example of a male connector according to an embodiment.

As shown in FIG. 1, a single host connector may have multiple "bays" in order to address many of the scalability concerns articulated herein. In particular, a male connector 1002 may have four bays and can include a substrate 1004, buffers 1006 and a housing 1008. The illustrated substrate 1004 has a plurality of "peninsulas" 1010 (one peninsula for each bay), wherein each peninsula 1010 has a connection edge 1012. At least one of the planar sides of the substrate 1004 can be a power side (not shown). The illustrated, buffers 1006 and logic (e.g., IO, signaling) contacts are coupled to a side of the substrate 1004 that is opposite the power side. The male connector 1002 may be coupled to a motherboard (not shown) or other suitable substrate. Each peninsula 1010 may have a plurality of pairs: of contact pads 2002 and reference pads 2004. Alternating rows of contacts are staggered to form a plurality of lanes of contacts in the example shown wherein each lane of contacts can be substantially perpendicular 10 the connection edge.

Figure 2:
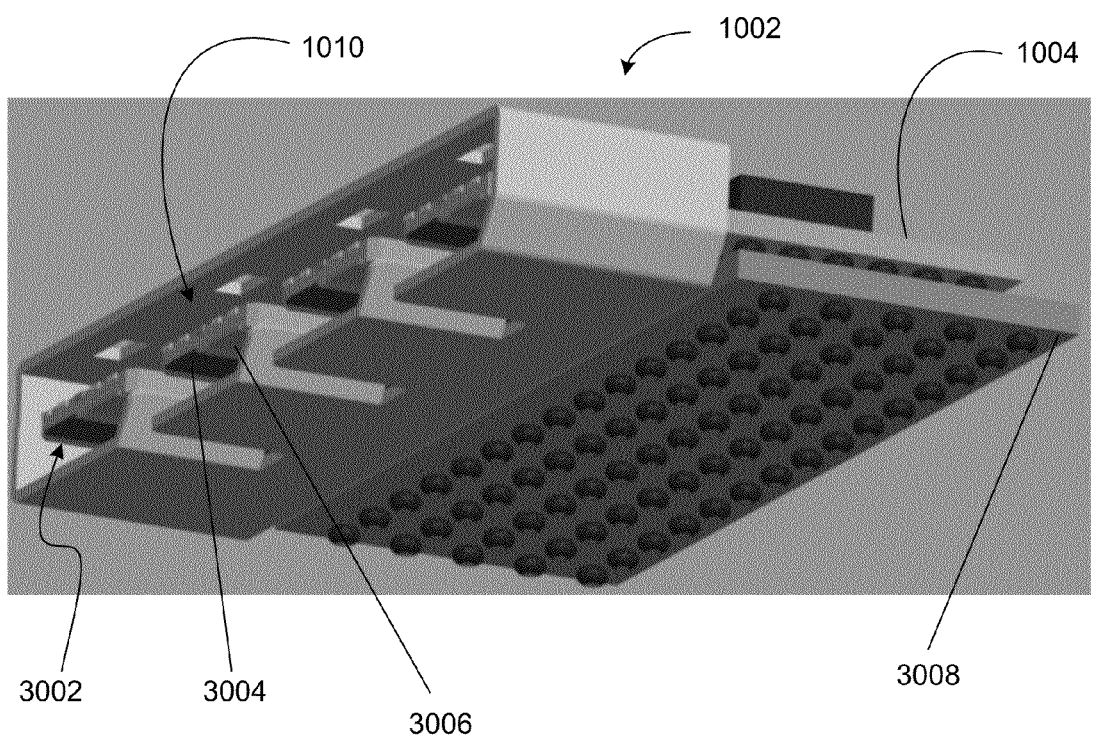
FIG. 2 shows a bottom perspective view of an example of a male connector according to an embodiment.

FIG. 2 shows a power side 3002 of the substrate 1004 in the male connector 1002. The power side 3002 may include a power contact 3004 and a ground contact 3006 on each peninsula 1010. The substrate 1004 may be connected to an interposer 3008, which is used to spread out the contacts to a wider pitch for easier connection to a larger substrate such as a motherboard (not shown).

Figure 3:
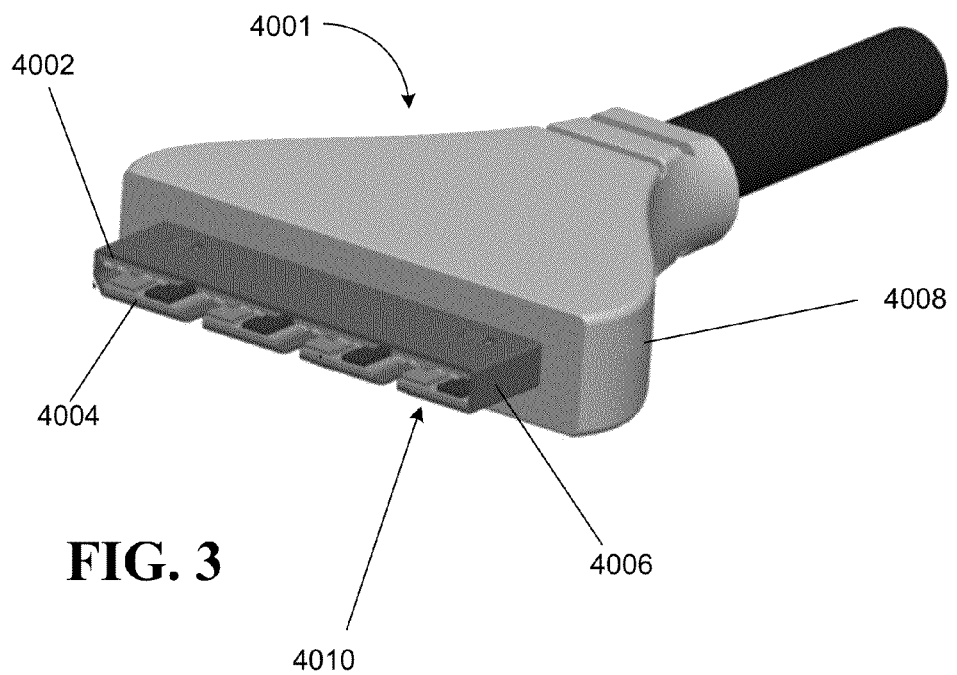
FIG. 3 shows a perspective view of an example of a female connector according to an embodiment.

A female connector 4001 is shown in FIG. 3. The female connector 4001 may have multiple bays and can include a first substrate 4002, a second substrate 4004 and an integrated buffer (not shown) coupled to a surface of at least one of the first and second substrates 4002, 4004. In the illustrated example, each substrate has a substantially planar face in opposition to the planar face of the other substrate. As with the male substrate discussed above, a housing 4006 surrounds the plurality of substrates of the connector 4001, wherein the housing 4006 can be keyed and notched. The key can be an indented corner of the housing to ensure that only a female connector connects with a male connector. The notch may be on an upper side of the substrate and is used to maintain a locked connection between a male connector and a female connector.

The difference between a male connector and a female connector may be that a male connector has a single substrate and a female connector has two substrates that would sandwich the male substrate during operation. On one side of the substrate of a male connector can be a plurality of logic and power contacts and on the other side can be a plurality of power and ground contacts. The first substrate 4002 of the female connector 4001, on the other hand, may have logic and power contacts only on one side of the substrate 4002, wherein the second substrate 4004 can be positioned opposite the first substrate 4002 and can have power and ground contacts on only one side of the substrate 4004. A protective shell 4008 or covering can be placed over the entirety of the pair of substrates 4002 and 4004, wherein the shell 4008 can be any kind of material that protects against shock, bumps, bends, etc., such as rubber or plastic.

Each of the illustrated substrates 4002 and 4004 has peninsulas 4010 projecting outwardly from the substrate's center in the illustrated example. Thus, a single substrate may connect to the host (not shown). Alternatively, each peninsula can be a separate and independent substrate connecting directly to the host. Further, if the desire should ever arise, male and female peninsulas can be mixed together in the same connector. For example, a single male contact can be combined with a trio of female contacts.

Figure 4A:
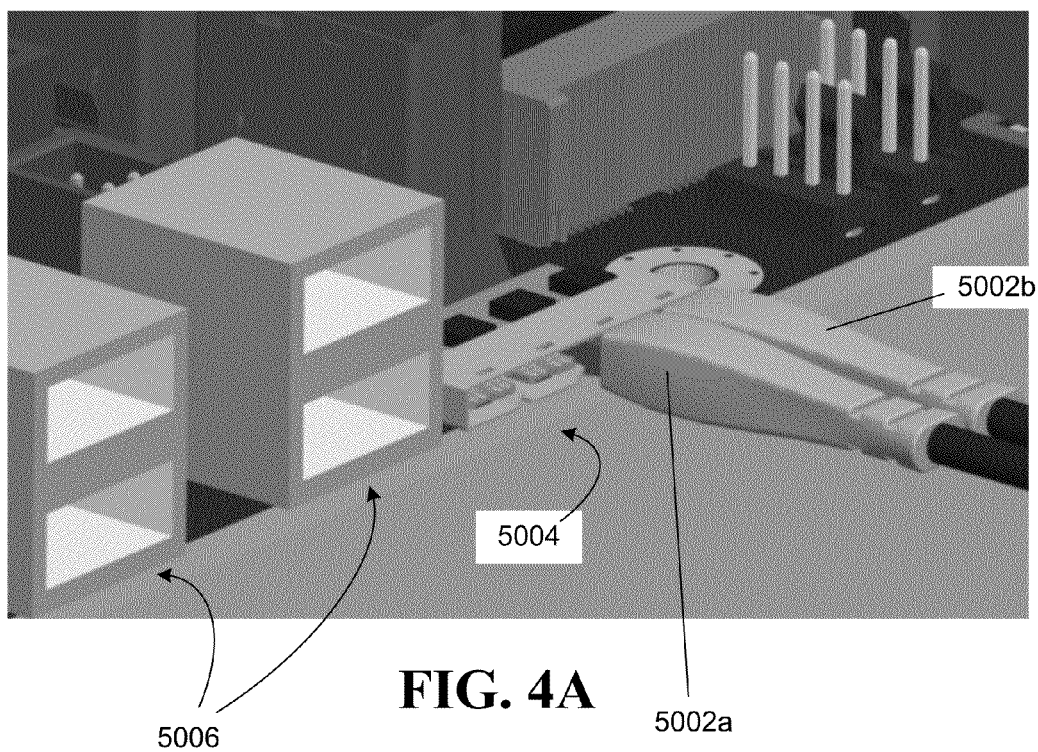
FIG. 4A shows a perspective view of an example of a system having multiple device cables plugged into a connector according to an embodiment.
Figure 4B:
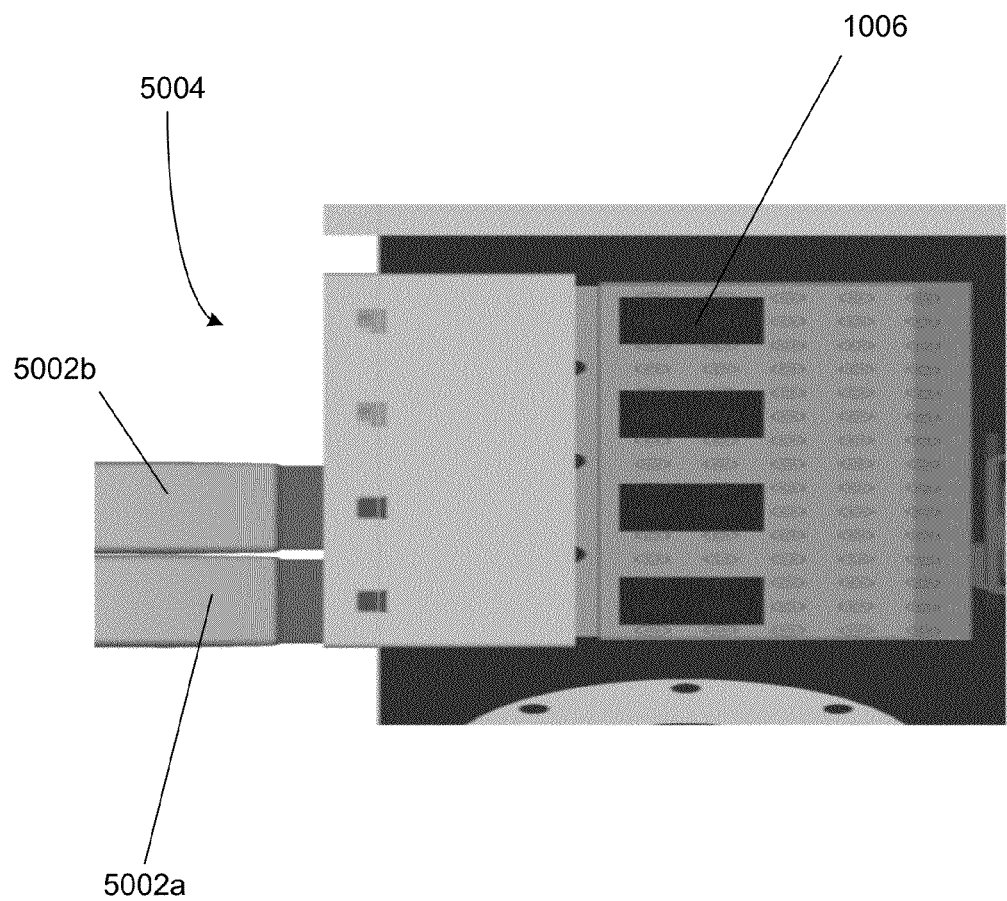
FIG. 4B shows a top view of an example of a multiple device cables plugged into a connector according to an embodiment.

FIG. 4A shows multiple device cables 5002a and 5002b plugged into a connector 5004. Conventional connector sockets 5006 are shown adjacent to the multiple device cables 5002a and 5002b. Although not necessarily to scale, the size of the connector 5004 shown is depicted as having a greatly reduced size relative to the conventional connector sockets 5006.

Thus, the present connector provides a scaling solution by "ganging" multiple connectors together. Existing solutions may be limited to 10 Gb/s or less, due in large part to connector bandwidth limitations. A scalable, configurable bandwidth solution can be made possible through the effective combination of multiple "bays" into a single connector. Moreover, available bandwidth can be distributed across multiple connected devices based on the individual device demand. For example, each bay may have 4 A current carrying capability. Thus, four times the performance of traditional scalability could be available with "pay as on go" capability and up to 16 A current carrying capacity in the example shown. In addition, high power demand can be supported by using robust power contacts to support up to 4 A consumption per bay (16 A total) for bus powered devices.

In the illustrated example, each bay can be mated to a separate connector, thus accommodating up to 4 devices. A given device may use multiple bays, however, in order to access higher bandwidth. In particular, the female connector of FIG. 3 is an example of a cable with a "4×" connector that would consume all of the bays on a host/device. As shown in FIGS. 5A and 5B, on the other hand, use of all of the peninsulas is not necessary as two separate cables can be connected to the host connector, thereby using less than all power available to the connector. The benefit of this approach is that may create a "pay as needed" method for bandwidth consumption. If the bandwidth demand for a device is satisfied by a single bay, then it need only put a single bay in use, and can use a cable with the minimum number of connectors. Only those devices that need more bandwidth are then configured with the cost of the additional bay (or bays).

As the disclosed IO connector is scalable across multiple generations, each lane of the disclosed IO connector might operate at about 8 Gb/s. As such, with a total of eight lanes per peninsula and four peninsulas per connector, the total connector bandwidth may be 256 Gb/s or more (e.g., 280 Gb/s). For the subsequent generations, each of the lanes might operate at 64 Gb/s, which would make the total achievable connector bandwidth 1024 Gb/s or more (e.g. 1120 Gb/s). As a result, over first, second and third generations, etc., the disclosed IO connector may be applicable to fifteen years' worth of bandwidth scalability.

Bandwidth usage can be further optimized by dynamically defining the transmission direction for each pair of contacts. In particular, a number of possible operable transceiver configurations are achievable. For example, the transmission direction can be unidirectional, bi-directional, simultaneously bi-directional, and so forth. In the unidirectional case, a transmitter can always be a dedicated transmitter and, similarly, a receiver can always be a dedicated receiver. In the bi-directional case, a data lane can be configured to be either as receiver or a transmitter at each side of the link. For simultaneous hi-directional configurations, both transmitter and receiver may share the same contacts and use them at the same time.

Legacy support for USB 3.0 devices may be possible through the use of "dongles," similar to the way in which USB keyboards are connected to the PC via the PS2 keyboard port. Legacy support for lower bandwidth devices (e.g. keyboards, mice) may be possible via wireless connection or other connection means. Cost/power/performance characteristics of the interface to each platform can also be tailored if desired.

This disclosed IO interface can enable the characteristics of the interface to be tailored to a particular platform and may include a "V-Squared trade-off" in power vs. performance, as well as complete power down and fast re-start from power down. Regarding the V-Squared trade-off, consider the CMOS circuit dynamic power consumption equation:

$$P=ACV^2F$$

where P is the power consumed, A is the activity factor, i.e., the fraction of the circuit that is switching, C is the switched capacitance, V is the supply voltage, and F is the clock frequency. If a capacitance of C is charged and discharged by a clock signal of frequency F and peak voltage V, then the charge moved per cycle is CV and the charge moved per second is CVF. Since the charge packet is delivered at voltage V, the energy dissipated per cycle, or the power, is $CV^2F$. The data power for a clocked flip-flop, which can toggle at most once per cycle, will be $\frac{1}{2}CV^2F$. When capacitances are clock gated or when flip-flops do not toggle every cycle, their power consumption will be lower. Hence, a constant called the activity factor ($0 \geq A \geq 1$) is used to model the average switching activity in the circuit.

The present connector may therefore provide a long term scaling solution. As higher capacity storage and hand held devices enter the market in the 10+ year time frame, no change to the connector form factor may be required in order to satisfy increasing bandwidth demand. Instead, the demand could be met through usage of multiple bays in parallel. Note that white this disclosure has shown only single and quad-bay connectors, dual, tri-bay and other configurations are also possible.

The contact pads on the substrate can be configured in a plurality of four rows, wherein the rows can be substantially parallel to the connection edge of the substrate. Thus, where a former IO connector interface would have only a single row of contact pairs, the present IO connector interface can provide 128 GB/s to 2 TB/s of total bandwidth, aggregated over the 4 bays, depending upon the data rate of individual pairs and the number of pairs used per bay. The result is a highly scalable bandwidth solution that allows for cost optimization depending upon individual device requirements.

The contacts disclosed herein can be pads, pins, protrusions or other electrical contacts. If the contacts of the female connector are pads, the contacts of the male connector may be a protruding contact like a pin or other raised contact in order to ensure proper coupling of the male and female contacts with each other. The rows of contacts may be offset from each other to avoid wear of the contacts. This may particularly be a consideration with regard to protruding contacts. The lower the amount of interference friction generated, the lower the amount of wear.

The buffer disclosed above can be coupled to the first side or the second side of each substrate. The butler may have an integrated voltage regulator (VR, not shown) capable of providing multiple, dynamically scalable, supply voltages. In particular, the VR may have a one or more scalable supply outputs (e.g., $V_{cc}$ IO, not shown) coupled to one or more power contacts when a male connector is mated with female connector. In any of the embodiments disclosed herein, a single buffer can be used to dynamically power all of the peninsulas or multiple buffers, i.e., one buffer per peninsula or one buffer for a group of peninsulas, can be used to dynamically power less than all of the peninsulas of the substrate.

Each lane may also be operable at less than maximum rates 1 Gb/s as opposed to 8 Gb/s). Accordingly, the full bandwidth range for a connector could be 1 Gb/s with one operable lane or signal pair or as much as 512 Gb/s or more with eight 64 Gb/s lanes operable. Moreover, power may be scalable so that the power through the connector can be as low as approximately single digit milli-Watts to as high as approximately several Watts of power.

If the substrates are independent substrates and not a protrusion of a larger base substrate, the substrates can be arranged coplanar with each of the other substrates or the substrates can be arranged in series, i.e., arranged in a plurality of planes. Each substrate may include a plurality of signaling contacts and one or more ground contacts. The power contacts can have a longitudinal axis that is substantially parallel to a longitudinal axis of the substrate. In addition, each row of contacts can be stacked substantially parallel to the connection edge, wherein each connection edge can be coupled to a separate buffer.

In one example, each bay of the housing can be a female housing with a height measuring about 6 mm, and a depth measuring about 10 mm or a male housing having a height measuring no more than about 3 mm, and a depth measuring no more than about 5 mm. The bays can be separated b a sub-housing divider such as a metal or plastic strip or tab.

Embodiments may therefore include a male IO interface having a plurality of substrates, wherein each substrate has a connection edge with a first side and a second side. The IO interface can also have at least one integrated buffer coupled to at least one of the first side and the second side of each substrate, and a plurality of rows of contacts coupled to the first side of each substrate. Each row of contacts may be stacked substantially parallel to the connection edge.

In addition, embodiments may include a female IO interface having a plurality of pairs of substrates. Wherein each pair of substrates includes a first substrate having a first contact surface and a second substrate having a second contact surface that opposes the first contact surface. Each substrate may further include a connection edge. The IO interface can also have at least one integrated buffer coupled to at least one of the first and second substrate of each pair of substrates, and a plurality of rows of contacts coupled to the first contact surface of each pair of substrates. Each row of contacts may be stacked substantially parallel to the connection edge.

Other embodiments can include a male IO interface having a substrate with a first side, a second side and a plurality of connection edges. The IO interface may also have at least one integrated buffer coupled to at least one of the first side and the second side of the substrate, and a plurality of rows of contacts coupled to the first side of the substrate, wherein each row of contacts is stacked substantially parallel to at least one of the plurality of edges.

Example sizes/models/values/ranges may have been given, although embodiments of the present invention are not limited to the same. As manufacturing techniques mature over time, it is expected that devices of smaller sizes could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e. such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. might be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:
1. A male input/output (IO) interface comprising:
   a plurality of substrates, each substrate having a connection edge with a first side and a second side;
   at least one integrated butler coupled to at least one of the first side and the second side of each substrate; and
   a plurality of rows of contacts coupled to the first side of each substrate, wherein each row of contacts is stacked substantially parallel to the connection edge.
2. The IO interface recited in claim 1, wherein the substrates are coplanar with each of the other substrates of the plurality of substrates.
3. The IO interface of claim 1, wherein alternating rows of contacts are staggered to form a plurality of lanes of contacts, and wherein each lane of contacts is substantially perpendicular to the connection edge.
4. The IO interface of claim 3, wherein a transmission direction of each pair of contacts is to be at least one of unidirectional, alternating bi-directional and simultaneous bi-directional.
5. The IO interface of claim 3, wherein a scalable bandwidth of each lane is to be between gigabits per second or less and tens of gigabits per second or more.
6. The IO interface of claim 1, Wherein each row includes a plurality of signaling contacts, and one or more power contacts, wherein the second side of each substrate includes a power contact and a ground contact, and wherein the power contacts are to support four amps of power consumption.
7. The IO interface of claim 6, wherein the buffer includes an integrated voltage regulator having one or more supply outputs coupled to the power contacts.
8. The IO interface of claim 1, further including a housing substantially surrounding the interface, the housing having a height measuring about 6 mm, and a depth measuring about 10 mm.

9. The IO interface of claim 1, wherein each of the plurality of substrates is to be selectively operable independent of other substrates to provide a scalable bandwidth configuration for the IO interface.

10. The IO interface of claim 1, wherein the integrated buffer is to allocate available bandwidth across multiple connected devices based on individual device demand.

11. A female input/output (IO) interface comprising:
a plurality of pairs of substrates, each pair of substrates including a first substrate having a first contact surface and a second substrate having a second contact surface that opposes the first contact surface, wherein each substrate further includes a connection edge;
at least one integrated buffer coupled to at least one of the first and second substrate of each pair of substrates; and
a plurality of rows of contacts coupled to the first contact surface of each pair of substrates;
wherein each row of contacts is stacked substantially parallel to the connection edge.

12. The IO interface of claim 11, wherein alternating rows of contacts are staggered to than a plurality of lanes of contacts, and wherein each lane of contacts is substantially perpendicular to the connection edge.

13. The IO interface of claim 12, wherein a transmission direction of each pair of contacts is to be at least one of unidirectional, alternating bi-directional and simultaneous bi-directional.

14. The IO interface of claim 12, wherein a scalable bandwidth of each lane is to be between gigabits per second or less and tens of gigabits per second or more.

15. The IO interface of claim 11, wherein each row includes a plurality of signaling contacts and one or more power contacts, wherein the second contact surface includes as power contact and a ground contact, and wherein the power contacts are to support four amps of power consumption.

16. The IO interface of claim 15, wherein the integrated buffer includes an integrated voltage regulator having one or more supply outputs coupled to the power contacts.

17. The IO interface of claim 11, wherein each of the plurality of pairs of substrates is to be selectively operable independent of other substrates to provide a scalable bandwidth configuration for the IO interface.

18. The IO interface of claim 11, further including a housing substantially surrounding the interface, the housing having a height measuring no more than about 3 mm, and a depth measuring no more than about 5 mm.

19. A male input/output (IO) interface comprising:
a substrate having a first side, a second side and a plurality of connection edges;
at least one integrated buffer coupled to at least one of the first side and the second side of the substrate; and
a plurality of rows of contacts coupled to the first side of the substrate;
wherein each row of contacts is stacked substantially parallel to at least one of the plurality of connection edges.

20. The IO interface of claim 19, wherein alternating rows of contacts are staggered to form a plurality of lanes of contacts, and wherein each lane of contacts is substantially perpendicular to at least one of the plurality of connection edges.

21. The IO interface of claim 20, wherein a transmission direction of each pair of contacts is to be at least one of unidirectional, alternating bi-directional and simultaneous bi-directional.

22. The IO interface of claim 20, wherein a scalable bandwidth of each lane is to be between gigabits per second or less and tens of gigabits per second or more.

23. The IO interface of claim 19, wherein each row includes a plurality of signaling contacts and one or more power contacts, wherein the second side includes a power contact and a ground contact, and wherein the power contacts are to support four amps of power consumption.

24. The ID interface of claim 23, wherein the integrated buffer includes an integrated voltage regulator having one or more supply outputs coupled to the power contacts.

25. The IO interface of claim 19, further including a housing surrounding the interface, the housing having a height measuring about 6 mm, and a depth measuring about 10 mm.

26. The IO interface of claim 19, further including a dongle, wherein, if coupled to one or more of the plurality of connection edges, the dangle supports communication with a Universal Serial Bus device.

* * * * *